United States Patent [19]
Burger et al.

[11] Patent Number: 5,358,883
[45] Date of Patent: Oct. 25, 1994

[54] LATERAL BIPOLAR TRANSISTOR

[75] Inventors: Wayne R. Burger; Yee-Chaung See, both of Phoenix, Ariz.

[73] Assignee: Motorola, Inc., Schaumburg, Ill.

[21] Appl. No.: 105,490

[22] Filed: Aug. 12, 1993

Related U.S. Application Data

[63] Continuation of Ser. No. 829,658, Feb. 3, 1992, abandoned.

[51] Int. Cl.$^5$ .......................... H01L 21/265
[52] U.S. Cl. ........................ 437/32; 437/31; 437/162; 437/152; 437/154; 148/DIG. 124; 148/DIG. 96
[58] Field of Search ............... 257/517, 557, 558, 754, 257/755, 640; 437/31, 32, 162, 152, 154; 148/DIG. 124, DIG. 96

[56] References Cited

U.S. PATENT DOCUMENTS

| | | | |
|---|---|---|---|
| 4,080,619 | 3/1978 | Suzuki | 257/640 |
| 4,196,440 | 4/1980 | Anantha et al. | 257/557 |
| 4,375,999 | 3/1983 | Nawata et al. | 437/154 |
| 4,485,393 | 11/1984 | Kumamaru et al. | 257/640 |
| 4,532,695 | 8/1985 | Schuermeyer | 257/640 |
| 4,860,085 | 8/1989 | Feygenson | 257/755 |
| 5,065,209 | 11/1991 | Spratt et al. | 257/755 |
| 5,086,005 | 2/1992 | Hirakawa | 437/32 |
| 5,128,272 | 7/1992 | Ramde | 437/162 |
| 5,139,961 | 8/1992 | Solheim et al. | 437/32 |

FOREIGN PATENT DOCUMENTS

| | | | |
|---|---|---|---|
| 55-134956 | 10/1980 | Japan | 257/557 |
| 1283839 | 11/1989 | Japan | 257/640 |
| 0288330 | 11/1990 | Japan | 437/154 |
| 2081507 | 2/1982 | United Kingdom | 437/152 |
| 2166292 | 4/1986 | United Kingdom | 257/557 |

OTHER PUBLICATIONS

Tamba et al., "A Novel CMOS-Compatible Lateral Bipolar Transistor for High-Speed BiCMOS LSI", IEDM 1990, pp. 395–398.

Lu et al., "Simulations of Collector Resistance of PNP Transistors for Complemetary Bipolar Technology", Solid State Electronics, vol. 32, #8, pp. 675–678, 1988.

Primary Examiner—Tom Thomas
Assistant Examiner—Tuan Nguyen
Attorney, Agent, or Firm—Robert F. Hightower; Joe E. Barbee

[57] ABSTRACT

A lateral bipolar transistor (10) includes a retrograde doping profile (21) that is formed within a substrate (11) to form the transistor's (10) collector region (14). A base region (16) that includes an inactive base area and an active base area (17) is formed in the collector region (14). An emitter (18) is formed within the active base area (17) wherein current (22) flows through the emitter (18) through the active base area (17) and through the collector region (14). The base region, the emitter, and a collector contact region are all formed by driving dopants from an overlying polysilicon layer.

11 Claims, 3 Drawing Sheets

LATERAL BIPOLAR TRANSISTOR

This application is a continuation of prior application Ser. No. 07,829,658, filed Feb. 3, 1992 now abandoned.

BACKGROUND OF THE INVENTION

The present invention relates, in general, to semiconductor devices, and more particularly, to a novel lateral bipolar transistor and method of manufacture.

In the past, the semiconductor industry has employed various bipolar processing methods to produce lateral bipolar transistors. These lateral bipolar transistors generally are similar to standard vertical bipolar transistors which have a base electrode positioned between the transistor's emitter and collector electrodes. The configuration of these prior lateral, bipolar transistors generally results in a transistor that occupies a large area. The transistor's large size results in large spacings between the transistor's active elements, such as emitter to collector spacing, and in a large base region. Large active element spacing increases carrier transit time and carrier storage within the transistor thereby limiting the transistor's performance. Such lateral transistors generally have a cutoff frequency of less than seven gigahertz (GHz). Large base regions also increase the transistor's parasitic capacitance which further limits the transistor's performance.

Additionally, the transistor's base ohmic contact is typically positioned between the emitter and the collector ohmic contact thereby creating a large distance between the emitter and the collector. This large distance increases the transistor's collector resistance and limits the transistor's performance.

Accordingly, it is desirable to have a lateral bipolar transistor that occupies a small area, that has a high cutoff frequency (greater than seven GHz), and that has an emitter electrode positioned between the base and collector electrodes.

SUMMARY OF THE INVENTION

Briefly stated, the present invention includes forming a lateral bipolar transistor in a doped well. A retrograde doping profile is employed to form a low resistance collector region in a portion of the well. A base region of the transistor includes both an inactive base area and an active base area which are within the well. An emitter of the transistor is within the active base area. A collector ohmic contact is immediately adjacent to the active base so that current flows through the emitter through the active base area and through the low resistance collector region.

DETAILED DESCRIPTION OF THE DRAWINGS

Figure 1:
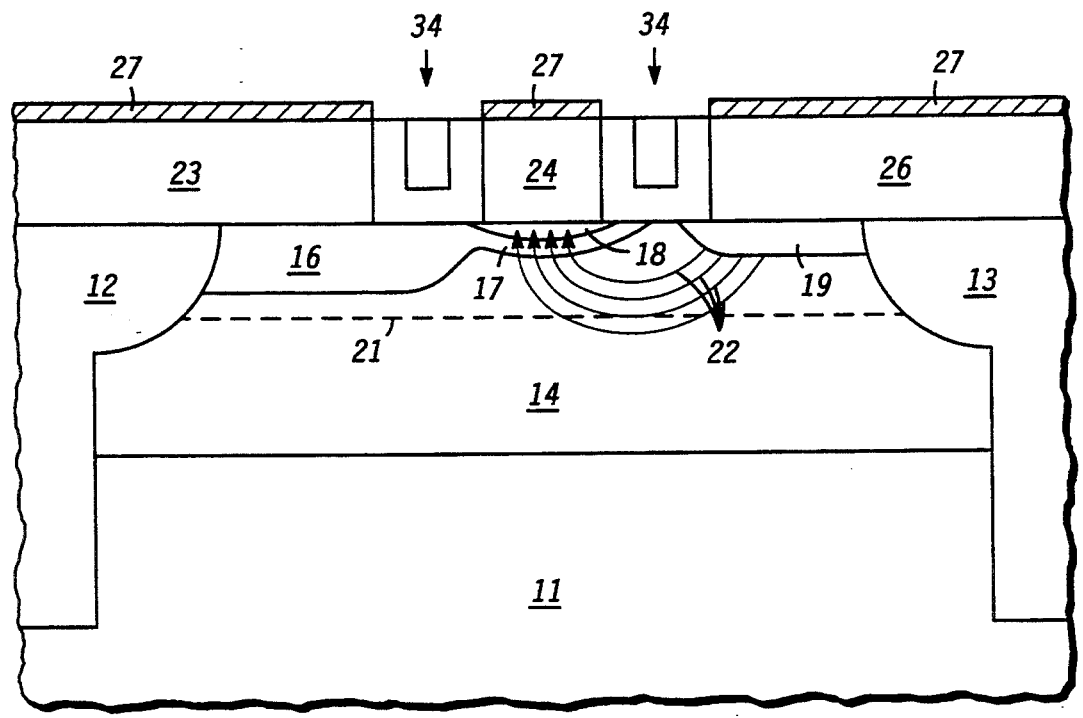
FIG. 1 illustrates an enlarged cross-section of a lateral bipolar transistor embodiment in accordance with the present invention.

FIG. 1 illustrates an enlarged portion of a high performance lateral bipolar transistor 10 that occupies a small area. Transistor 10 is formed on a substrate 11, and includes an emitter region 18, a collector ohmic area 19, a base region 16 that includes an active base area 17, and a collector well 14 that has a retrograde doping profile thereby enabling well 14 to function as the collector of transistor 10. A first isolation region 12 and a second isolation region 13 electrically isolate transistor 10 from other devices that are formed on substrate 11. Consequently, regions 12 and 13 have a predetermined depth into substrate 11 that is greater than a predetermined depth of well 14. Regions 12 and 13 can be a variety of different isolation structures that are well known to those skilled in the semiconductor art including, but not limited to, junction isolation regions and trenches that are filled with a dielectric.

Since well 14 forms the active collector of transistor 10, well 14 must provide a low resistance conduction path from active base area 17 to collector ohmic area 19. This low resistance path is created by forming well 14 with a retrograde doping profile. This retrograde doping profile typically has a doping concentration that gradually varies from a predetermined surface concentration to a maximum or peak concentration at a predetermined depth into well 14, as illustrated by a dashed line 21, and gradually decreases at further depths into well 14. This retrograde doping profile is formed by semiconductor processing techniques that are well known to those skilled in the semiconductor art. The portion of well 14 near the peak doping concentration, dashed line 21, has a very low resistance and provides a low resistance collector area for collector current flow between active base area 17 and collector ohmic area 19. A plurality of arrows 22 illustrate collector current flow for the case of an NPN transistor. Generally the peak doping concentration is between approximately 0.2 and 0.7 microns below the surface of well 14 although in the preferred embodiment the peak doping concentration has a depth between approximately 0.3 and 0.5 microns. This peak doping profile provides accurate control of the collector current flow and facilitates maintaining the collector current in a small area of well 14. Since the peak is below the surface, collector current flow between active base area 17 and collector ohmic area 19 is sufficiently below the surface of well 14 to substantially prevent surface defects from affecting the current flow. Consequently, the retrograde doping profile facilitates improving the gain of transistor 10. This is a significant improvement over prior lateral bipolar transistors wherein the majority of current flow is at the transistor's surface. Additionally, the retrograde doping profile allows the surface concentration to be small thereby providing a high collector-base and collector-emitter breakdown voltage, and also minimizing the collector-base parasitic capacitance of transistor 10. In the preferred embodiment, the peak doping concentration is at least ten times the surface doping concentration. Prior lateral bipolar transistors typically have a higher surface concentration and a corresponding higher collector-base and higher emitter-base capacitance than transistor 10. As will be seen hereinafter, base region 16 is doubly diffused in order to form a shallow active base area 17 that is an extension of an extrinsic or inactive base area of base region 16. The inactive base area facilitates forming an ohmic contact to a base contact 23 and provides a low resistance electrical path to active base area 17.

Emitter 18 is positioned within active base area 17 to further reduce the thickness of active base area 17 and minimize the distance between emitter 18 and the collector portion of well 14. In the preferred embodiment, emitter 18 has a maximum depth of approximately 0.1 microns, and active base area 17 has a maximum thickness of approximately 0.1 microns beyond emitter 18. Consequently, carrier transit time between emitter 18 and the collector formed by well 14 is minimized thereby maximizing the performance of transistor 10. In addition, collector ohmic area 19 is immediately adjacent to active base area 17. Since there is no base ohmic contact between emitter 18 and collector ohmic area 19 that prevents lateral current flow, this configuration further improves the performance of transistor 10.

A collector contact 26 provides an ohmic connection to collector ohmic area 19 and facilitates electrical connection to the collector (well 14) of transistor 10. In a similar manner, an emitter contact 24 provides an ohmic connection to emitter 18. Consequently, emitter 18 and emitter contact 24 are between base contact 23 and collector contact 26. This arrangement provides a symmetrical transistor that permits emitter 18 to be formed along with the gate of a CMOS transistor, thus, transistor 10 is compatible with CMOS and BICMOS processing techniques. In the preferred embodiment, contacts 23, 24, and 26 are formed from polysilicon. Also in this preferred embodiment, each of contacts 23, 24, and 26 are covered with a silicide layer 27, such as titanium silicide or platinum silicide, in order to reduce the resistance of contacts 23, 24, and 26. As will be seen hereinafter, a plurality of dielectric plugs 34 separates contacts 23 and 24, and also separates contacts 24 and 26.

Several features of transistor 10 combine to provide the high performance obtained from transistor 10. Some of these features include, among other things, the short distance from emitter 18 to the low resistance collector area, the current confinement provided by the retrograde doping profile, and the reduced collector-base parasitic capacitance. For example, an NPN transistor, such as transistor 10, has a cut-off frequency that is in excess of 20 GHz, and a similar PNP transistor has a cut-off frequency that is in excess of 10 GHz.

Figure 2:
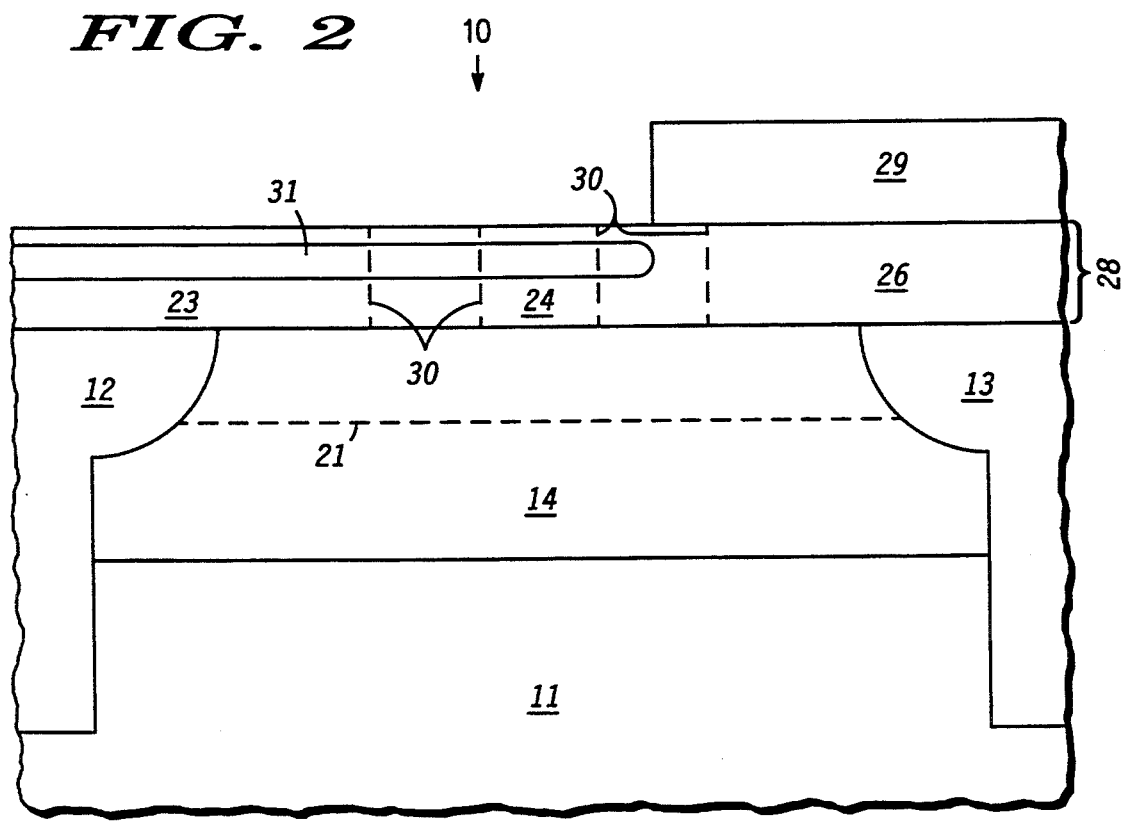
FIG. 2 illustrates a stage in the manufacturing of the transistor of FIG. 1.

FIG. 2 illustrates a stage in the process of forming transistor 10 of FIG. 1. Elements of FIG. 2 that are the same as FIG. 1 have the same reference numerals. At the manufacturing stage of FIG. 2, isolation regions 12 and 13, and collector well 14 previously have been formed on substrate 11. The region of substrate 11 between regions 12 and 13 forms a transistor.

In the preferred embodiment, substrate 11 is P-type and well 14 is N-type. Also in this preferred embodiment, well 14 has a peak doping concentration that is between approximately $8 \times 10^{16}$ and $5 \times 10^{17}$ atoms/cm$^3$. The peak doping concentration is formed by a high energy (300 Kev. to 400 Kev.) phosphorus implant. During subsequent processing operations, the dopants diffuse until a final peak doping concentration is reached that is approximately ten times the surface concentration. This retrograde profile facilitates forming transistor 10 without an epitaxial layer or a buried layer. Consequently, the structure of transistor 10 minimizes the collector-substrate capacitance and increases the collector to substrate breakdown voltage of transistor 10.

A polysilicon layer 28 has been formed to cover regions 12 and 13, and well 14. Contacts 23, 24, and 26 will subsequently be created by forming openings, illustrated by a plurality of dashed lines 30, in polysilicon layer 28. A base implant mask 29 is applied to cover the portion of polysilicon layer 28 that will subsequently form collector contact 26 and also the portion of polysilicon layer 28 between contacts 24 and 26. Mask 29 is utilized while implanting dopants into the exposed portion of polysilicon layer 28 in order to form a base dopant 31. The position of mask 29 ensures that dopant 31 extends past emitter contact 24 in order to allow for alignment tolerances during the subsequent formation of contacts 23, 24, and 26. In the preferred embodiment, a boron or boron difluoride (BF$_2$) dopant is implanted to at a dosage of between approximately $3 \times 10^{14}$ atoms/cm$^2$ and $6 \times 10^{14}$ atoms/cm$^2$.

Figure 3:
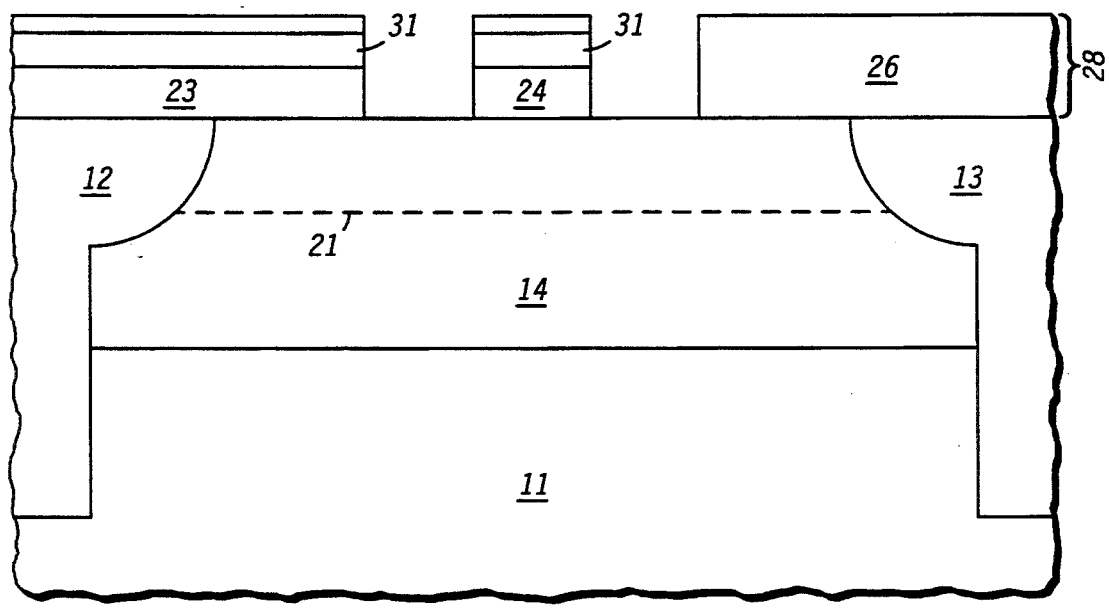
FIG. 3 illustrates the transistor of FIG. 2 at a subsequent manufacturing stage.

Referring to FIG. 3, contacts 23, 24, and 26 are created by forming openings in layer 28. Elements of FIG. 3 that are the same as FIG. 2 have the same reference numerals. Subsequent to performing base dopant 31, mask 29 is removed. A mask is applied to cover the sections of polysilicon layer 28 that correspond to contacts 23, 24, and 26. Then, contacts 23, 24, and 26 are formed by etching openings in polysilicon layer 28 thereby leaving portions of base dopant 31 in contact 23 and in contact 24. Since contacts 23, 24, and 26 are formed from a single layer of polysilicon, contacts 23, 24, and 26 are self-aligned to each other which maximizes the performance to area ratio of transistor 10. In the preferred embodiment, an anisotropic reactive ion (RIE) etch is used.

Figure 4:
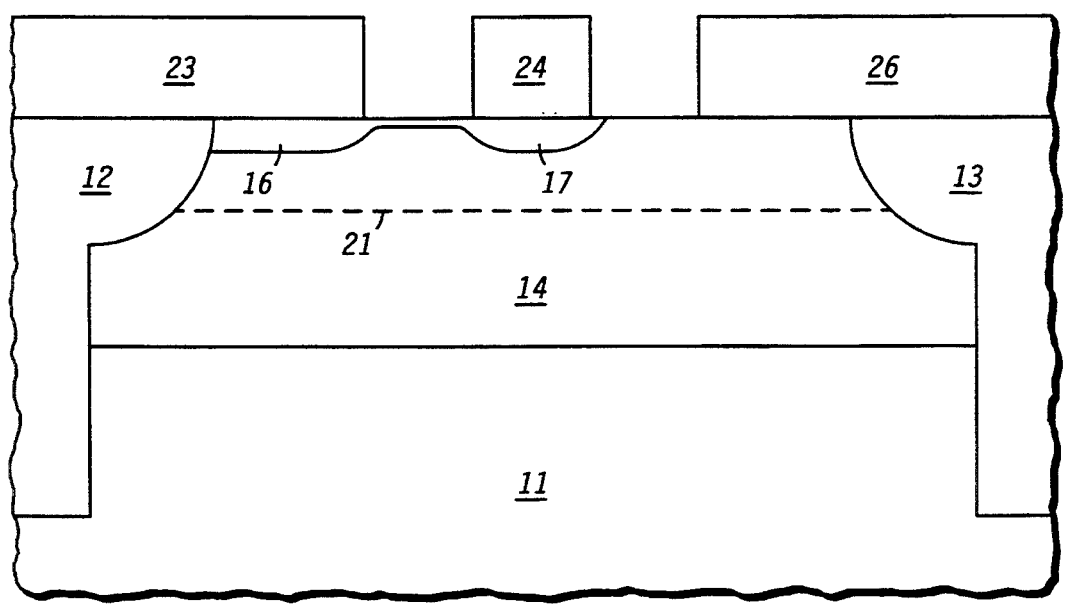
FIG. 4 illustrates the transistor of FIG. 3 after forming a base region.

FIG. 4 illustrates transistor 10 of FIG. 3 subsequent to diffusing the dopants of base dopant 31 (FIG. 3) from contacts 23 and 24 into well 14. In the preferred embodiment, the dopants are diffused approximately 1500 angstroms (Å) into well 14 and form a P-type base 16 that has a peak base doping concentration of between approximately $1 \times 10^{19}$ atoms/cm$^3$ and $5 \times 10^{19}$ atoms/cm$^3$. Subsequent to the diffusion, an additional base linkage implant is performed through the opening between contacts 23 and 24 to ensure that active base area 17 is electrically connected to the inactive portion of base 16.

Figure 5:
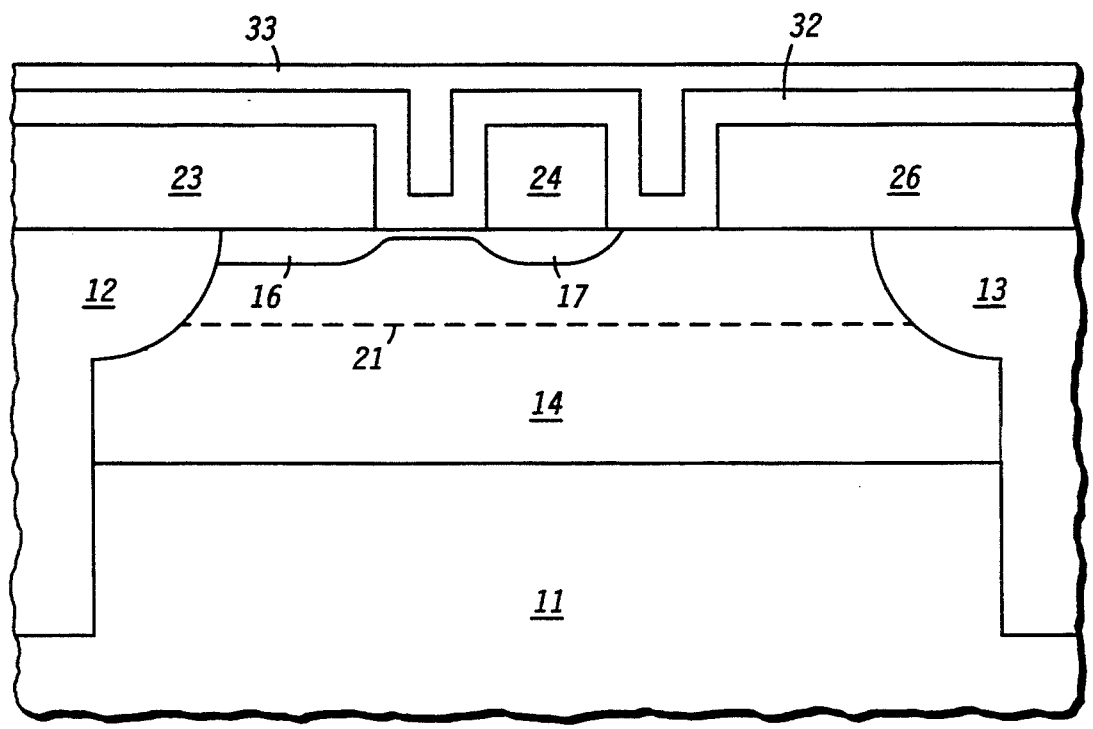
FIG. 5 illustrates the transistor of FIG. 4 after forming a dielectric layer.

Referring to FIG. 5, a dielectric is applied to cover and fill the spaces between contacts 23, 24, and 26. This dielectric will subsequently be formed into dielectric plugs 34 of FIG. 1. In the preferred embodiment, the dielectric is formed as a two layer dielectric that includes a conformal layer of silicon nitride 32 which is covered with a low temperature deposited layer of silicon dioxide 33. The dielectric is thinned in order to expose the surface of contacts 23, 24, and 26 and form dielectric plugs 34 of FIG. 1. The thinning procedure can be a variety of thinning methods that are well known to those skilled in the semiconductor art. In the preferred embodiment, an anisotropic reactive ion etch (RIE) employing an optical end point signal is utilized.

Figure 6:
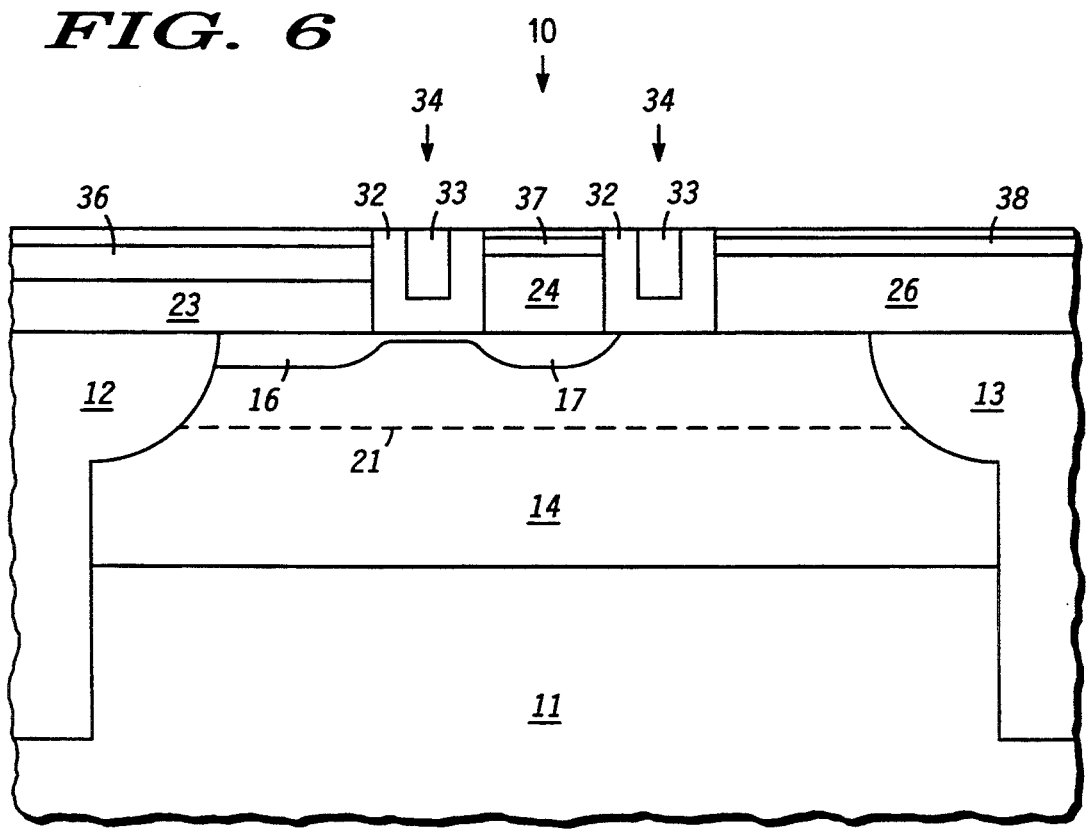
FIG. 6 illustrates the transistor of FIG. 5 after forming a dielectric plug.

FIG. 6 illustrates transistor 10 of FIG. 5 at a subsequent manufacturing stage. The elements of FIG. 6 that are the same as FIG. 5 have the same reference numerals. An inactive base dopant 36 is formed in contact 23 by covering contact 26, contact 24, plug 34 that is between contacts 24 and 26, and a portion of plug 34 that is between contacts 23 and 24 with a mask, then implanting a dopant into contact 23. In the preferred embodiment, either boron or boron difluoride is implanted at a dosage of between approximately $2 \times 10^{15}$ atoms/cm$^2$ and $5\times10^{15}$ atoms/cm$^2$. The mask is then removed, followed by the formation of an emitter dopant 37 and a collector dopant 38. Dopants 37 and 38 are formed by covering contact 23 and a portion of plug 34 that is between contacts 23 and 24 with a mask, then implanting impurities into contacts 24 and 26. In the preferred embodiment, an arsenic or a phosphorous impurity is implanted at a dosage between approximately $5\times10^{15}$ atoms/cm$^2$ and $2\times10^{16}$ atoms /cm$^2$. Plugs 34 prevent the implanting of impurities into base 16 and into well 14. Without dielectric plugs 34, impurities would be implanted into base area 16 and collector well 14 thereby lowering the breakdown voltage of transistor 10 and possibly preventing normal transistor operation.

Dopants 36, 37, and 38 are thermally activated and diffuse from contacts 23, 24, and 26 into well 14. Dopant 36 diffuses into the inactive area of base 16 thereby lowering the resistivity of the inactive area and enhancing the formation of an ohmic contact between contact 23 and base 16. In the preferred embodiment, dopant 36 results in a P-type doping concentration between $5\times10^{19}$ atoms/cm$^3$ and $2\times10^{20}$ atoms/cm$^3$ in the inactive base area. Dopant 37 is diffused into the active portion of base 17 to form emitter 18 (FIG. 1), and dopant 38 is diffused into well 14 to form collector ohmic area 19 (FIG. 1). During the diffusion, active base 17 is driven further into well 14 along with emitter 18 thereby creating a space between emitter 18 and active base 17 that is less than approximately 0.1 microns. In the preferred embodiment, emitter 18 and area 19 (FIG. 1) have a depth of between approximately 0.1 and 0.15 microns and also have an N-type doping concentration of between approximately $1\times10^{20}$ atoms/cm$^3$ and $3\times10^{20}$ atoms/cm$^3$. Consequently, emitter 18 and area 19 (FIG. 1) have substantially equal depths thereby ensuring that no other transistor elements obstruct current flow between base 17 and area 19 (FIG. 1). In addition, forming emitter 18 and area 19 at substantially equal depths improves the collector-base and the collector-emitter breakdown voltage of transistor 10. The thermal activation is performed by semiconductor processing methods that are well known to those skilled in a semiconductor art. In the preferred embodiment, a rapid thermal anneal is employed by exposing transistor 10 to a temperature between approximately 1000 and 1100 degrees Celsius for a time between ten seconds and one minute.

By now it should be appreciated that there has been provided a novel lateral bipolar transistor. A retrograde doping profile facilitates forming the collector region of the transistor. The transistor's emitter is positioned within the active base region of the transistor which minimizes the distance between the emitter and the collector region thereby minimizing carrier transit time and maximizing the transistor's performance. In addition, a retrograde doping profile minimizes collector base capacitance and improves the transistor's breakdown voltage. The processing methods provide a transistor structure wherein the collector and inactive portion of the base are symmetrically located about the transistor's emitter. The symmetry facilitates integrating such a transistor into CMOS type processes and with CMOS transistors. Dielectric plugs between the transistor's contacts provide a self-aligning feature that allows for mask misalignments.

We claim:

1. A method of forming a transistor comprising:
providing a semiconductor substrate of a first conductivity type without an epitaxial layer and having a first surface;
forming a collector region of a second conductivity type by doping a portion of the substrate with a retrograde doping profile that has a peak doping concentration a first distance from the first surface wherein the peak doping concentration forms a low resistance collector region;
forming a base dopant in a layer overlying the first surface;
forming a base region within the collector region wherein the base region is on the first surface and includes an active base area formed from a first portion of the base dopant and an inactive base area formed from a second portion of the base dopant;
forming an emitter region within the active base area wherein current substantially flows through the emitter region through the active base region and through the low resistance collector region; and
forming a collector ohmic area immediately adjacent to the active base area.

2. The method of claim 1 wherein forming the collector ohmic area includes forming the emitter region substantially centered between the inactive base area and the collector ohmic area so that collector current substantially flows through the emitter region through the active base area through the low resistance collector region and through the collector ohmic area.

3. The method of claim 1 wherein forming the emitter region within the active base area includes forming the emitter region having a thickness that is not greater than approximately 0.1 microns within the active base area having a thickness that is not greater than approximately 0.1 microns beyond the emitter region.

4. The method of claim 1 wherein the forming the collector region step includes forming the first distance between approximately 0.3 and 0.5 microns.

5. The method of claim 1 wherein forming the emitter region within the active base area includes forming the emitter region having an emitter contact that is between a base contact and a collector contact.

6. The method of claim 1 wherein the forming the collector region step includes forming the peak doping concentration to be at least 10 times a surface doping concentration.

7. A method of forming a lateral bipolar transistor comprising:
providing a substrate having a retrograde doping profile with a peak doping concentration that is a first distance from a first surface of the substrate;
covering a portion of the substrate with a layer of polysilicon;
forming a base dopant of a first conductivity type within a portion of the polysilicon layer;
forming a plurality of openings in the polysilicon layer to form the polysilicon layer into a base contact, an emitter contact, and a collector contact wherein a first portion of the base dopant is in the base contact and a second portion of the base dopant is in the emitter contact;
diffusing the first portion of the base dopant and the second portion of the base dopant into the substrate wherein the first portion of the base dopant forms an inactive base region and the second portion of the base dopant forms an active base region;
forming a dielectric plug in each of the plurality of openings;

forming an inactive base dopant of the first conductivity type within the base contact;

forming an emitter dopant of a second conductivity type within the emitter contact and a collector dopant of the second conductivity type within the collector contact wherein the emitter dopant and the collector dopant are formed substantially simultaneously;

diffusing the emitter dopant into the active base region to form an emitter, the collector dopant into the substrate to form a collector ohmic area, and the inactive base dopant into the inactive base region; and covering the base contact, the emitter contact, and the collector contact with a conductor.

8. The method of claim 7 wherein forming the base dopant of the first conductivity type within the portion of the polysilicon layer includes implanting a dopant at a dosage of between approximately $3 \times 10^{14}$ atoms/cm$^2$ and $6 \times 10^{14}$ atoms/cm$^2$ wherein the dopant is one of boron or boron difluoride.

9. The method of claim 7 wherein diffusing the first portion of the base dopant and the second portion of the base dopant into the substrate includes forming the inactive base region and the active base region to have a peak doping concentration of between approximately $1 \times 10^{19}$ atoms/cm$^3$ and $5 \times 10^{19}$ atoms/cm$^3$.

10. The method of claim 7 wherein forming an inactive base dopant of the first conductivity type within the base contact includes forming a dopant having a dosage of between approximately $2 \times 10^{14}$ atoms/cm$^2$ and $5 \times 10^{14}$ atoms/cm$^2$ wherein the dopant is one of boron or boron difluoride.

11. The method of claim 7 wherein forming the emitter dopant of the second conductivity type within the emitter contact and the collector dopant of the second conductivity type within the collector contact includes forming the emitter dopant and the collector dopant having a dosage of between approximately $5 \times 10^{15}$ atoms/cm$^2$ and $2 \times 10^{16}$ atoms/cm$^2$ wherein the dopant is one of arsenic or phosphorous.

* * * * *